(12) United States Patent
Markovich

(10) Patent No.: US 6,280,805 B1
(45) Date of Patent: Aug. 28, 2001

(54) UTILITY METER COVER APPARATUS

(76) Inventor: Joseph G. Markovich, 200 SE. Saddlebrook Dr., Lee's Summit, MO (US) 64082

( * ) Notice: Subject to any disclaimer, the term of this patent is extended or adjusted under 35 U.S.C. 154(b) by 0 days.

(21) Appl. No.: 09/295,835

(22) Filed: Apr. 21, 1999

(51) Int. Cl.[7] ..................................................... B32B 1/02
(52) U.S. Cl. ........................... 428/34.1; 428/99; 324/110; 361/672
(58) Field of Search ..................... 428/99, 34.1; 361/672; 324/110

(56) References Cited

U.S. PATENT DOCUMENTS

| | | |
|---|---|---|
| 1,991,076 | 2/1935 | Bradshaw . |
| 2,044,643 | 6/1936 | Sloop . |
| 2,359,628 | 10/1944 | Daly . |
| 2,381,329 | 8/1945 | Young et al. . |
| 2,882,454 * | 4/1959 | Davis, III .............................. 324/110 |
| 3,591,835 | 7/1971 | Sloop . |
| 3,659,457 | 5/1972 | Ostrowski . |
| 4,747,016 | 5/1988 | Sloop, Sr. . |

* cited by examiner

*Primary Examiner*—Alexander S. Thomas
(74) *Attorney, Agent, or Firm*—Shook, Hardy & Bacon L.L.P.

(57) ABSTRACT

A utility meter cover apparatus is provided for protecting an existing utility meter casing from vandalism. The cover apparatus includes a generally tubular base adapted to be received over an end wall of the casing and permanently fixed to the casing by an adhesive or the like. The base includes an end opening that provides access to the end wall of the casing and to the window and any hardware mounted in the end wall. A cover is sized for receipt on the base over the end opening, and is movable relative to the base between a closed position covering the end opening and an open position exposing the end opening. A lock assembly is connected between the base and the cover, and is shiftable between a locked position in which the cover cannot be moved from the closed position and an unlocked position in which the cover can be moved to the open position to allow access to the end face of the meter casing.

6 Claims, 2 Drawing Sheets

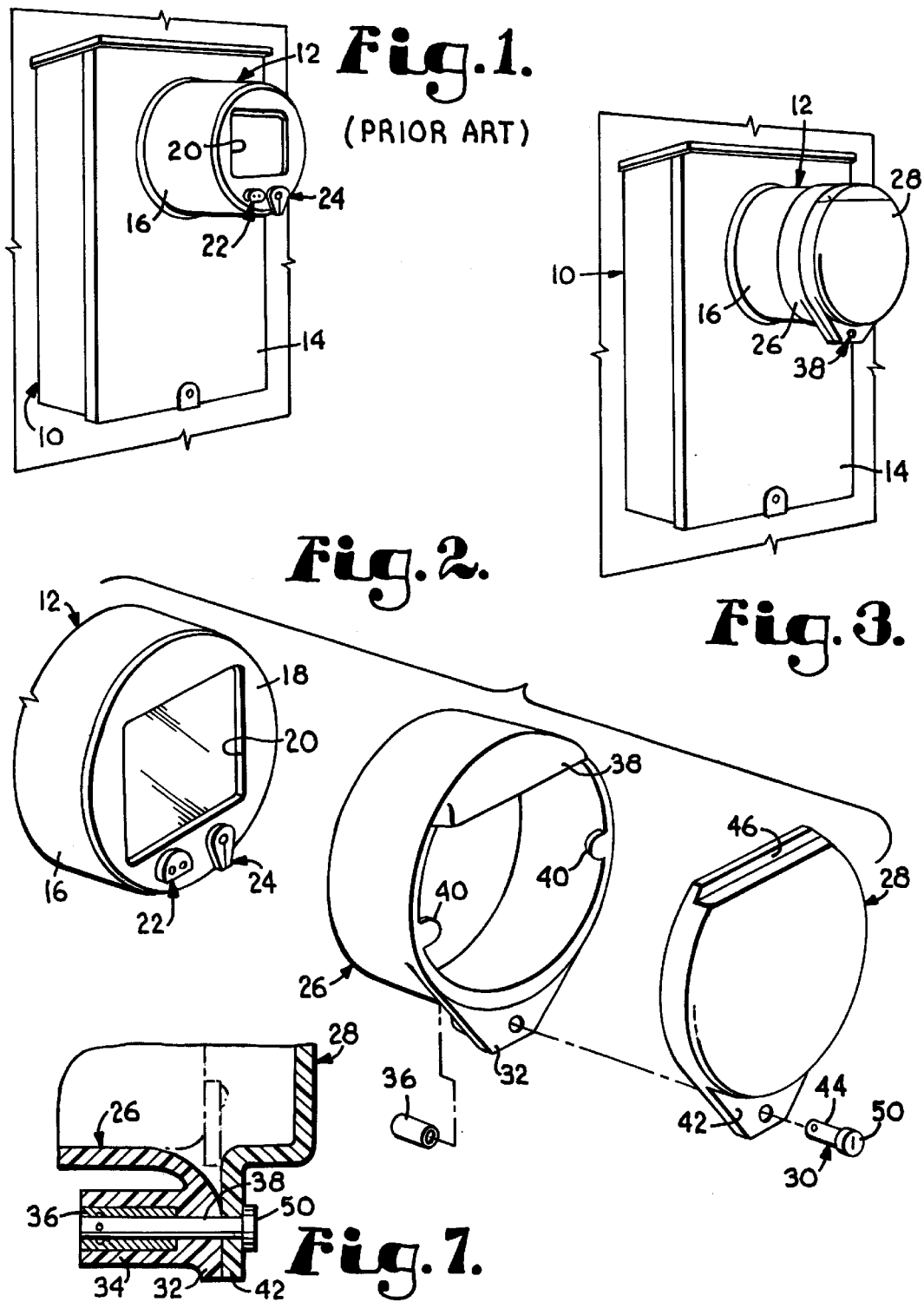

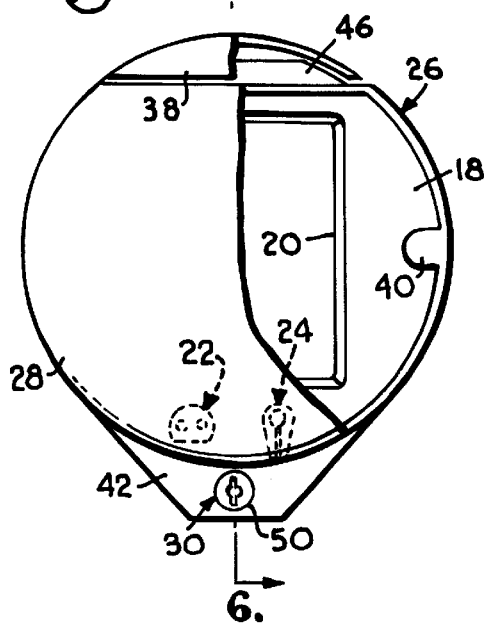
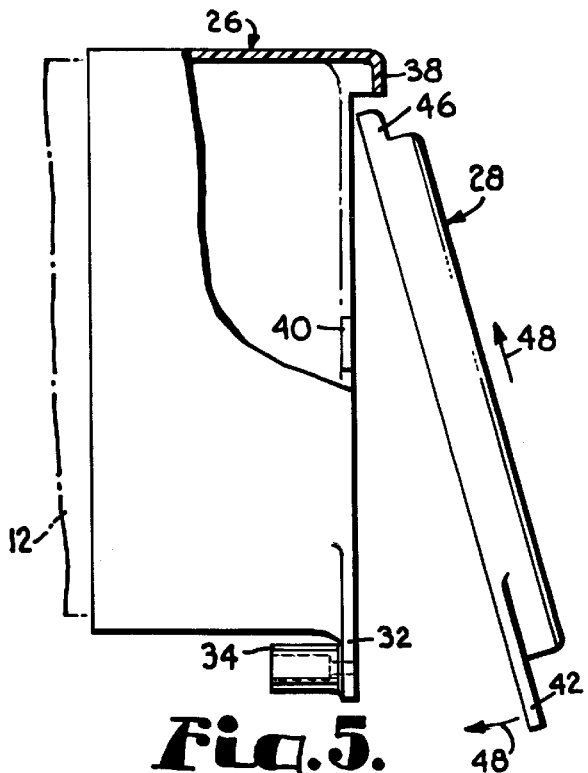
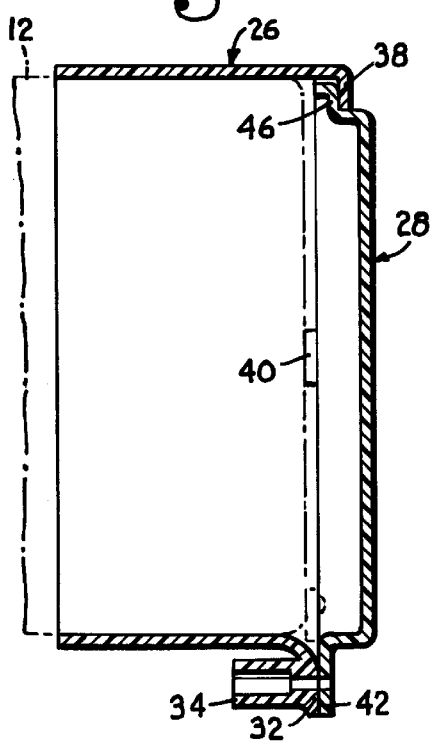
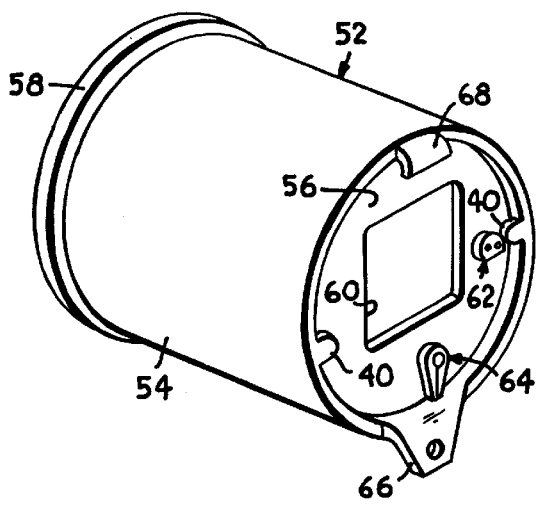

UTILITY METER COVER APPARATUS

CROSS-REFERENCE TO RELATED APPLICATIONS

"Not Applicable".

STATEMENT REGARDING FEDERALLY SPONSORED RESEARCH OR DEVELOPMENT

"Not Applicable".

BACKGROUND OF THE INVENTION

The present invention relates generally to casings for utility meters, and more particularly to a cover apparatus for use on a meter casing to protect the casing and meter from vandalism.

Utility meters are employed in electrical distribution systems to meter the usage of electricity by customers so that the electricity provider can determine how much to charge the customer during a particular billing cycle. Such meters are typically mounted within a housing at the point of use of the electricity, and are typically located within easy access for reading and maintenance. Unfortunately, by positioning the meters within easy access to service providers, they are also easily accessible to vandals and others wishing to damage or tamper with the meters or their housings.

It is known to provide a special housing for meters, wherein protective covers are provided which shield the meter from vandalism and tampering. However, such housings are typically used in the manufacture of new meters, and cannot be easily adapted for use with existing housings. As such, a technical problem is presented as to how to protect existing utility meters in the field from vandalism and tampering. A related problem is that of providing a housing construction that protects the meter from vandalism and tampering without substantially impeding the reading and maintenance work that must be done periodically by authorized service providers.

BRIEF SUMMARY OF THE INVENTION

It is an object of the present invention to solve the technical problems left unaddressed by the prior art, and to provide a cover apparatus that can be retrofit on existing meters to provide protection against vandalism and tampering without requiring modification to the existing meter housing.

In accordance with these and other objects evident from the following description of a preferred embodiment of the invention, a utility meter cover apparatus is provided for use on a utility meter having a casing presenting a generally cylindrical side wall and a generally circular end wall. The cover apparatus includes a base, a cover, and a lock assembly. The base is generally tubular, being sized and shaped for receipt over the end wall of the casing so that it can be fixed to the side wall by an adhesive or other permanent attachment expedient. The base presents an end opening adapted to provide access to the end wall of the casing, including any windows or hardware that might be presented by or protrude from the end wall. The cover is sized for receipt on the base over the end opening, and is movable relative to the base between a closed position covering the end opening and an open position exposing the end opening. The lock assembly is connected between the base and the cover, and is shiftable between a locked position in which the cover cannot be moved from the closed position and an unlocked position in which the cover can be moved to the open position to allow access to the end face of the meter casing.

By providing a construction in accordance with the present invention, numerous advantages are realized. For example, by providing a cover apparatus having a base sized for affixation to the existing casing of a utility meter, it is possible to retrofit the apparatus on meters already in the field to provide protection to such meters against vandalism and tampering. In addition, by employing an apparatus having a cover movable from the closed and locked position, it is possible for a service provider to easily and quickly gain access to the casing and meter for inspection and maintenance purposes. The shape of the apparatus also permits other components of the meter to be serviced without interference because the profile presented by the cover apparatus is closely matched to that of the casing.

Preferably, the cover of the inventive apparatus is formed of a synthetic resin material that allows the passage of radio frequency waves transmitted by the meter in some applications to a remote receiver mounted elsewhere in the distribution system.

BRIEF DESCRIPTION OF THE SEVERAL VIEWS OF THE DRAWING

The preferred embodiment of the present invention is described in detail below with reference to the attached drawing, wherein:

FIG. 1 is a perspective view of a conventional utility meter;

FIG. 2 is an exploded view of a cover apparatus constructed in accordance with the preferred embodiment of the invention;

FIG. 3 is a perspective view of the cover apparatus of the preferred embodiment installed on the conventional utility meter;

FIG. 4 is a front elevational view of the cover apparatus, illustrating a cover forming a part thereof in a closed position, and being partially broken away to illustrate various features thereof;

FIG. 5 is a side elevational view of the cover apparatus, illustrating the cover in an open position, and being partially broken away to illustrate various features thereof;

FIG. 6 is a sectional view taken along line 6—6 of FIG. 4, illustrating the cover in the closed position;

FIG. 7 is a fragmentary sectional view taken along line 6—6 of FIG. 4, illustrating details of a lock assembly forming a part of the apparatus; and FIG. 8 is a perspective view of a meter casing constructed in accordance with the present invention and capable of use with the cover of the apparatus.

DETAILED DESCRIPTION OF THE INVENTION

A conventional utility meter is illustrated in FIG. 1, and broadly includes conventional metering circuitry protected in a housing mounted at or near a point of use of electricity. The circuitry used in the meter does not form a part of the present invention, and it is understood that the invention can be employed with any type of circuitry presently known in the art.

The housing is also conventional, and generally includes a metal box 10 from which a generally cylindrical casing 12 extends. The metal box includes top, bottom and side walls, and is fitted with a front cover 14 that is locked in place on the box, but which can be unlocked and removed from the box to permit access to the circuitry. The front cover 14 is provided with a central opening through which the casing 12 protrudes, and is removed from the box by sliding the front cover laterally away from the box until the cover clears the casing.

The casing 12 is typically made of a synthetic resin material, and includes a generally tubular shape, presenting a slightly tapered cylindrical side wall 16 and a circular end wall 18. The end of the casing opposite the end wall is open, and the side wall includes a circumferential flange by which the casing can be secured to the meter within the box so that the casing cannot be removed without removing the front cover of the box. The remainder of the outer surface of the side wall between the flange and the end wall 18 is uninterrupted, being free of windows or other hardware.

The end wall 18 of the casing includes a central, rectangular or square window 20 through which a meter display or indicator is visible for inspection, a port 22 via which a computer or the like can be connected to the meter for programming and the like, and a reset lever 24 or other mechanical device for actuating testing of the meter and/or for setting the mode of operation of the meter display. The window 20 is covered by a pane of glass or other suitable transparent material, and is permanently secured within the casing to prevent access to the meter circuitry through the opening defining the window.

The port 22 and reset lever 24 are both readily accessible, and the port can be used by anyone with the appropriate equipment and knowledge to reprogram various parameters used to operate the meter circuitry. For example, it is possible in many conventional meters to use a computer connected to the port to set such parameters as the pulse values, the kilowatt hours, the kilovars, and the watts-per-revolution of a disc forming a part of the meter circuitry. Although this feature of the meter is a convenience for service providers, it presents the possibility that the meter will be tampered with by anyone who is properly equipped.

The meter and housing elements thus far described are conventional, and although the preferred embodiment of the invention is described with reference to this particular meter construction, it is noted that one of skill in the art will appreciate how to employ the inventive apparatus on meters and housings of different brands and constructions. As such, the invention is not limited to use on any particular type of meter or housing.

The cover apparatus is illustrated in FIG. 3, and broadly includes a base 26, a cover 28, and a lock assembly 30. With reference to FIG. 2, the base 26 is generally tubular, being sized and shaped for receipt over the end wall of the casing so that it can be fixed to the side wall by an adhesive or other permanent attachment expedient. In the preferred embodiment, the inner surface of the base is generally cylindrical, having a slight taper to match that of the casing side wall. However, if a casing is used that presents a side wall having a different shape, the base would be constructed with an inner surface having a corresponding shape.

The base presents axially opposed inner and outer end openings, wherein the inner end is received on the side wall of the casing, and the outer end is adapted to provide access to the end wall of the casing. The base protrudes slightly from the end wall of the casing, and includes a radially protruding flange 32 by which the lock assembly is supported on the base. The flange 32 is illustrated in FIG. 7, and includes a generally planar outer end face defining a bearing surface against which the cover seats when positioned on the base, and a collet 34 protruding from the rear end of the flange toward the opposite end of the base. The collet 34 defines an axial cavity having a predetermined diameter sized for receipt of one element 36 of the lock assembly, and a hole is formed in the flange that is collinear with the cavity. The hole includes a diameter that is smaller than that of the cavity so that the lock element 36 is retained in the base and cannot be pulled through the hole in the flange.

Returning to FIG. 2, the base 26 includes a hood 38 that is disposed diametrically opposite the flange 32 relative to the outer end opening. The hood 38 protrudes longitudinally from the side wall of the base and includes an end wall that extends radially inward of the base into the outer end opening. As such, the hood defines a hook that cooperates with the cover 28 to hold the cover in place on the base during use, as described below. A pair of diametrically opposed tabs 40 are also provided on the base and are spaced circumferentially halfway between the hood 38 and the flange 32 on either side of the end opening. Each tab 40 projects radially into the outer end opening and defines a bearing surface against which the cover rests during use. As such, the tabs prevent the cover from being pushed into the outer end opening of the base by vandals.

The cover 28 is sized for receipt on the base over the outer end opening, and is movable relative to the base between a closed position covering the end opening and an open position exposing the end opening. The cover is constructed of a synthetic resin material that permits the passage of radio frequency signals such that any such signals transmitted by the meter are able to pass through the apparatus toward a remote receiver located elsewhere in the utility distribution system.

The cover 28 is generally dish shaped, including a front wall and a circumferential side wall that is of generally the same diameter as the side wall of the body. A depending, radially extending flange 42 protrudes from the side wall of the cover, and includes a generally planar inner face defining a bearing surface that seats against the flange 32 of the base when the cover is positioned on the base, as shown in FIG. 7. The flange 42 includes a hole that aligns with the hole in the flange 32 when the cover is properly positioned on the base, and the hole includes a diameter substantially equal to the diameter of the hole in the flange 32 in order to receive a second element 44 of the lock assembly, as described below.

Returning to FIG. 2, the cover is truncated to define a straight edge immediately opposite the flange. The portion of the side wall extending along the straight edge of the cover is stepped to present a lip or shoulder 46 sized and shaped for receipt beneath the hood 38 of the base when the cover is positioned on the base in the manner indicated by the arrows 48 in FIG. 5. As such, when the cover 28 is inserted beneath the hood 38, and the flanges 32, 42 are moved together to the position shown in FIG. 6, the cover can be locked in place on the base. As illustrated in FIG. 4, with the cover 28 secured over the outer end opening of the base, access to the end wall of the casing, the window, the port, and the reset lever is prevented.

With reference to FIG. 7, the lock assembly 30 is connected between the base and the cover, and is shiftable between a locked position in which the cover cannot be moved from the closed position and an unlocked position in which the cover can be moved to the open position to allow access to the end face of the meter casing. An exemplary lock assembly includes a conventional barrel lock having first and second elements 36, 44. The first element 36 of the assembly is received in the collet and presents a longitudinal bore within which the second element 44 is received. The first element 36 also presents an inner circumferential groove that aligns with a radially protruding detent of the second element when the second element is inserted into the first element and locked.

The second element 44 presents a generally cylindrical outer surface from which the detent protrudes, and includes an enlarged head 50 presenting an end face in which a socket is provided for receipt of a key. When the key is moved to a locking position in the socket, an internal mechanism of the lock assembly is shifted axially, forcing the detent radially outward into the groove and preventing retraction of the detent. As such, the second element 44 is locked to the first element 36 and the cover cannot be removed from the base. When the key is used to unlock the lock assembly, the internal mechanism of the second element releases the detent for inward radial movement, allowing the second element to be removed from the first element, and permitting the cover to be removed from the base.

Although the lock assembly 30 has been described with reference to the preferred embodiment illustrated in the attached drawing figures, it is noted that substitutions may be made and equivalents employed herein without departing from the scope of the invention as recited in the claims. Any other suitable assembly that secures the flanges of the base and cover together to prevent unauthorized removal of the cover could be employed.

Likewise, other components of the inventive cover apparatus could change while remaining within the scope of the invention. For example, although the apparatus is illustrated as including a cover having a shoulder that engages the hood of the base to secure the cover in place, it would be possible to substitute a hinged connection in which the cover is hingedly connected to the base for pivotal movement about an axis extending in a direction generally parallel to the plane in which the window is disposed so that the cover can be pivoted between the open and closed positions. Other known expedients for connecting the cover to the base may also be employed so long as the cover can be shifted between closed and open positions and locked shut to prevent vandalism and tampering.

By providing an apparatus as described herein, numerous advantages are achieved. For example, the construction of the apparatus permits it to be fitted on an existing utility meter such as that illustrated in FIG. 1, protecting the exposed end of the meter casing from vandalism and tampering. In addition, because the cover apparatus corresponds to the shape of the casing and presents a relatively low radial profile, it is possible to access the metal box 10 and to remove the front cover 14 thereof without difficulty. Thus, none of the original utility of the meter is compromised by retrofitting of the cover apparatus.

A utility meter casing 52 is illustrated in FIG. 8, which incorporates many of the advantageous features of the cover assembly described above. The casing 52 is made of a synthetic resin material, and includes a generally tubular shape, presenting a slightly tapered cylindrical side wall 54 and a circular end wall 56. The end of the casing opposite the end wall is open, and the side wall includes a circumferential flange 58 by which the casing can be secured to the meter within the box so that the casing cannot be removed without removing the front cover of the box. The remainder of the outer surface of the side wall between the flange and the end wall is uninterrupted, being free of windows or other hardware.

The end wall 56 of the casing includes a central, rectangular or square window 60 through which a meter display or indicator is visible for inspection, a port 62 via which a computer or the like can be connected to the meter for programming and the like, and a reset lever 64 or other mechanical device for actuating testing of the meter and/or for setting the mode of operation of the meter display. The window is covered by a pane of glass or other suitable transparent material, and is permanently secured within the casing to prevent access to the meter circuitry through the opening defining the window.

The side wall 54 of the casing protrudes slightly from the end wall 56, and includes a radially protruding flange 66 by which the lock assembly is supported on the base. The flange 66 includes a generally planar outer end face defining a bearing surface against which the cover seats when positioned on the base, and a collet protruding from the rear end of the flange toward the opposite end of the base. The collet defines an axial cavity having a predetermined diameter sized for receipt of one element of the lock assembly, and a hole is formed in the flange that is collinear with the cavity. The hole includes a diameter that is smaller than that of the cavity so that the lock element is retained in the base and cannot be pulled through the hole in the flange.

The protruding portion of the side wall of the casing includes a hood 68 that is disposed diametrically opposite the flange 66 relative to the end wall. The hood 68 protrudes longitudinally from the end wall and includes a flange that extends radially inward of the side wall over the end wall. As such, the hood defines a hook that cooperates with the cover 28 to hold the cover in place on the base during use. A pair of diametrically opposed tabs 70 are also provided on the protruding section of the side wall, and are spaced circumferentially half way between the hood 68 and the flange 66 on either side of the end wall. Each tab 70 projects radially over the end wall and defines a bearing surface against which the cover rests during use. As such, the tabs prevent the cover from being pushed into the outer end opening defined by the protruding section of the side wall by vandals.

In use, the casing 52 is employed with the cover 28, as illustrated and described with reference to the cover apparatus illustrated in FIGS. 1–7, and the cover is positioned over the outer end opening of the casing by inserting the lip or shoulder of the cover beneath the hood and pressing the flanges of the cover and casing together. Thereafter, a lock as described herein is used to lock the cover in place, preventing access to the end wall, the window, the port, or the reset lever. Should a service provider need to inspect the window or gain access to the port or reset lever, the lock is unlocked and the cover is removed from the casing.

What is claimed is:

1. A utility meter cover apparatus for use on a utility meter having a casing presenting a side wall and an end wall, the apparatus comprising:

a generally tubular base adapted to be received over the end wall of the casing and fixed to the side wall, the base presenting an end opening adapted to provide access to the end wall of the casing;

a cover sized for receipt on the base over the end opening, the cover being movable relative to the base between a closed position covering the end opening and an open position exposing the end opening; and a lock assembly connected between the base and the cover, and being shiftable between a locked position in which the cover cannot be moved from the closed position and an unlocked position in which the cover can be moved to the open position to allow access to the end face of the meter casing.

2. The utility meter cover apparatus as recited in claim 1, wherein the cover is formed from a material that permits the passage of radio frequency signals.

3. The utility meter cover apparatus as recited in claim 1, wherein the cover is formed from a synthetic resin material.

4. The utility meter cover apparatus as recited in claim 1, wherein the base is formed of synthetic resin material.

5. The utility meter cover apparatus as recited in claim 1, wherein the base and cover each include a radially protruding flange, and the two flanges engage one another when the cover is in the closed position, the lock assembly securing the flanges together when in the locked position.

6. A utility meter cover apparatus for use on a utility meter having a casing presenting a side wall and an end wall, the apparatus comprising:

a generally tubular base adapted to be received over the end wall of the casing and fixed to the side wall, the base presenting an end opening adapted to provide access to the end wall of the casing, wherein the base includes a hood protruding into the end opening;

a cover sized for receipt on the base over the end opening, the cover being movable relative to the base between a closed position covering the end opening and an open position exposing the end opening, wherein the cover includes a lip sized for receipt beneath the hood in the closed position of the cover, the hood and lip engaging one another in the closed position to prevent removal of the cover while the lock assembly is in the locked position; and a lock assembly connected between the base and the cover, and being shiftable between a locked position in which the cover cannot be moved from the closed position and an unlocked position in which the cover can be moved to the open position to allow access to the end face of the meter casing.

\* \* \* \* \*